United States Patent
Lee et al.

(10) Patent No.: US 8,343,787 B2
(45) Date of Patent: Jan. 1, 2013

(54) METHOD FOR FABRICATING LIQUID CRYSTAL DISPLAY DEVICE

(75) Inventors: Cheol Hwan Lee, Suwon-si (KR); Jong Won Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/304,457

(22) Filed: Nov. 25, 2011

(65) Prior Publication Data

US 2012/0190143 A1 Jul. 26, 2012

(30) Foreign Application Priority Data

Nov. 26, 2010 (KR) .................. 10-2010-0118705

(51) Int. Cl.
*H01L 21/00* (2006.01)
*G09G 3/36* (2006.01)

(52) U.S. Cl. ............... 438/34; 438/30; 345/87

(58) Field of Classification Search .............. None
See application file for complete search history.

(56) References Cited

U.S. PATENT DOCUMENTS

| | | | | |
|---|---|---|---|---|
| 7,763,482 B2 * | 7/2010 | Kim | ................ | 438/30 |
| 8,173,225 B2 * | 5/2012 | Kim | ................ | 427/508 |
| 2006/0186409 A1 * | 8/2006 | Horino et al. | ............ | 257/59 |
| 2009/0081820 A1 * | 3/2009 | Park et al. | ............ | 438/34 |
| 2009/0127563 A1 * | 5/2009 | Bae et al. | ............ | 257/72 |
| 2009/0309101 A1 * | 12/2009 | Kim et al. | ............ | 257/59 |

* cited by examiner

*Primary Examiner* — Fernando L Toledo
*Assistant Examiner* — Priya Rampersaud
(74) *Attorney, Agent, or Firm* — Birch, Stewart, Kolasch & Birch, LLP

(57) ABSTRACT

A method of fabricating an LCD device is discussed. The method in one embodiment includes: forming a gate electrode and a gate pad on a substrate, which is defined into a display area corresponding to pixel regions and a non-display area corresponding to pad regions, through a first mask process; sequentially stacking a gate insulation film, an amorphous silicon layer, an impurity-doped amorphous silicon layer and a metal film on the substrate provided with the gate electrode and then forming an active layer, source/drain electrode and a data line through a second mask process which uses one of half-tone and diffraction masks; and forming a transparent conductive material on the substrate provided with the source/drain electrode and forming a pixel electrode through a third mask process.

6 Claims, 7 Drawing Sheets

<PAD REGION>   <DATA LINE REGION>   <PIXEL REGION>   <TFT REGION>

<PAD REGION>   <DATA LINE REGION>   <PIXEL REGION>   <TFT REGION>

METHOD FOR FABRICATING LIQUID CRYSTAL DISPLAY DEVICE

CROSS-REFERENCE TO RELATED APPLICATION

This application claims priority under 35 U.S.C. 119 to Korean Patent Application No. 10-2010-0118705, filed on Nov. 26, 2010, which is hereby incorporated by reference in its entirety.

BACKGROUND

1. Field of the Disclosure

This disclosure relates to a fabricating method of a liquid crystal display (LCD) device adapted to reduce a number of mask processes.

2. Description of the Related Art

In general, LCD devices control the light transmittance of a liquid crystal with a dielectric anisotropy using an electric field, in order to display an image. The LCD devices are usually fabricated by combining a color filter array substrate with a thin film transistor array substrate in the center of a liquid crystal layer.

Recently, LCD devices of several new modes have been developed in order to resolve a narrow viewing angle of the related art LCD device. LCD devices with wide viewing angle characteristics are classified into an in-plane switching (IPS) mode, an optically compensated birefringence (OCB) mode, a fringe field switching (FFS) mode, or others.

Among the LCD devices with the wide viewing angle, the IPS mode LCD device allows a pixel electrode and a common electrode to be arranged on the same substrate so that a horizontal electric field is induced between the electrodes. As such, major axes of liquid crystal molecules are aligned in a horizontal direction with respect to the substrate. Accordingly, the IPS mode LCD device has a wider viewing angle than that of a TN (Twisted Nematic) mode LCD device of the related art.

FIGS. 1A through 1G are cross-sectional views illustrating a method of fabricating an IPS LCD device according to the related art.

Referring to FIGS. 1A through 1G, a gate electrode 11 and a gate pad 13 are formed in a TFT (thin film transistor) formation region of (or distinguished from) a pixel region and a pad region by depositing a conductive metal on a substrate 10 and patterning the deposited metal. The substrate 10 is defined into a display area corresponding to a plurality of pixel regions and a non-display area corresponding to pad regions. The conductive metal for the gate electrode and pad 11 and 13 is selected from a conductive metal group including aluminum Al, an aluminum alloy (AlNd), copper Cu, tungsten W, molybdenum Mo and so on.

Subsequently, a gate insulation film 12, a semiconductor film 14 and a source/drain metal film 15 are sequentially formed on an entire surface of the substrate 10 provided with the gate electrode and pad 11 and 13. The gate insulation film 12 is formed by depositing at least one material selected from an inorganic insulation material group which includes silicon nitride $SiN_x$ and silicon oxide $SiO_2$. The semiconductor film 14 includes amorphous silicon (a-Si:H) and an impurity-doped amorphous silicon (n+a-Si:H).

Thereafter, first and second photo resist patterns 50a and 50b are formed on the TFT region and a data line region through a photolithography process, respectively. The first and second photo resist patterns 50a and 50b are prepared by forming a photo resist film on the entire surface of the substrate 10 and performing a half-tone or a diffraction mask process for the photo resist film.

Subsequently, as shown in FIGS. 1C and 1D, an etching process using the first and second photo resist patterns 50a and 50b as a mask is performed for the source/drain metal film 15 and the semiconductor film 14, so that an active layer 14a including a channel layer and an ohmic contact layer and source/drain electrodes 17b and 17a are formed on the gate insulation film 12. At the same time, a data line 25 is formed in the data line region and an active pattern 14b is formed under the data line 25.

In this way, when a TFT configured with the gate electrode 11, the active layer 14a and the source/drain electrodes 17b and 17a is formed on the substrate 10, a pixel electrode 19 is formed by depositing a transparent conductive material on the entire surface of the substrate 10 and etching the deposited transparent conductive material according to a photolithography process.

Afterword, a protective film 18 is formed on the substrate 10 provided with the pixel electrode 19 thereon, as shown in FIG. 1D. The protective film 18 can be formed by depositing at least one material selected from an inorganic insulation material group which includes silicon oxide $SiO_2$ and so on.

Next, a third photo resist pattern 60 is formed on the protective film 18. The third photo resist pattern 60 can be prepared by forming a photo resist film on the entire surface of the substrate 10 provided with the protective film 18 and exposing and developing the photo resist film according to a photolithography process.

When the third photo resist pattern 60 is formed, an etching process using the third photo resist pattern 60 as a mask is performed for the protective film 18. In accordance therewith, a contact hole 40 exposing the gate pad 13 on the pad region is formed.

After the contact hole 40 is formed, a common metal film 30 and a fourth photo resist pattern 70 are sequentially formed on the entire surface of the substrate 10, as shown in FIG. 1F. The common metal film 30 is formed of a transparent conductive material. The fourth photo resist pattern 70 is formed on the common metal film 30 through a photolithography process.

Thereafter, as shown in FIG. 1G, an etching process using the fourth photo resist pattern 70 as a mask is performed for the common metal film 30. In accordance therewith, a common electrode 31 is formed on the protective film within the pixel region, and a gate contact pad 35 is formed on the gate pad 13.

In this manner, the method of an IPS mode LCD device according to the related art includes first through fifth mask processes. The first mask process is used for forming the gate electrode and the gate pad. the second mask process is used for forming the active layer and the source/drain electrodes. The third mask process is used for forming the pixel electrode. The fourth mask process is used for forming the contact hole. The fifth mask process is used for forming the common electrode.

Each of the above-mentioned mask processes can be completed by: forming a material film for a desired pattern on a substrate; forming a photo resist film on the material film; exposing the photo resist film in a desired shape using a mask; partially stripping the exposed photo resist film to provide a desired photo resist pattern; and removing the material film exposed by the photo resist pattern, in order to pattern the material film in a desired shape.

As such, the mask processes force a washing process, a deposition process, a stripping process, and an etching process using a liquid chemical agent to be repeatedly performed. Moreover, after the deposition process is performed within a chamber, the processes that make the substrate externally exposed continue to proceed.

As described above, if the fabricating processes of an LCD device increase, it is common for the substrate to include pollutants during the fabrication of the LCD device. Due to this, the characteristics of the TFTs deteriorate.

In view of this point, it is necessary to reduce a number of the mask processes. The reduction of the mask processes may allow several extra processes to be similarly reduced. As such, it can prevent elements from losing quality due to the pollution of the substrate.

BRIEF SUMMARY

Accordingly, the present embodiment is directed to an LCD device fabrication method that substantially obviates one or more of problems due to the limitations and disadvantages of the related art.

An object of the present embodiments is to provide an LCD device fabrication method which is adapted to reduce a number of mask processes using an imprinting process.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an LCD device fabrication method includes: forming a gate electrode and a gate pad on a substrate, which is defined into a display area corresponding to pixel regions and a non-display area corresponding to pad regions, through a first mask process; sequentially stacking a gate insulation film, an amorphous silicon layer, an impurity-doped amorphous silicon layer and a metal film on the substrate provided with the gate electrode and then forming an active layer, source/drain electrode and a data line through a second mask process which uses one of half-tone and diffraction masks; forming a transparent conductive material on the substrate provided with the source/drain electrode and forming a pixel electrode through a third mask process; forming an organic film on the substrate provided with the pixel electrode and performing an imprinting process to form first and second depressions which are respectively positioned in the pixel and pad regions; performing an etching process for the organic film provided with the first and second depressions to form a contact hole in the pad region; sequentially forming a common metal film and a photo resist film on the substrate provided with the contact hole and performing one of etching and ashing processes to expose the common metal film on all the regions except the first depressions and the contact hole; and performing an etching process, which uses the remaining photo resist film within the first depression and contact hole as a mask, to form a common electrode on the pixel region and a gate contact pad on the pad region.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1A:
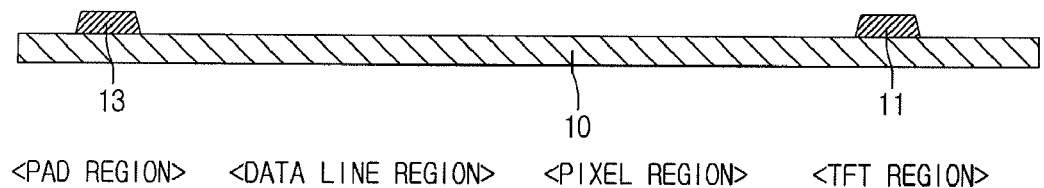
FIGS. 1A through 1G are cross-sectional views illustrating a method of fabricating an IPS mode LCD device according to the related art.
Figure 1B:
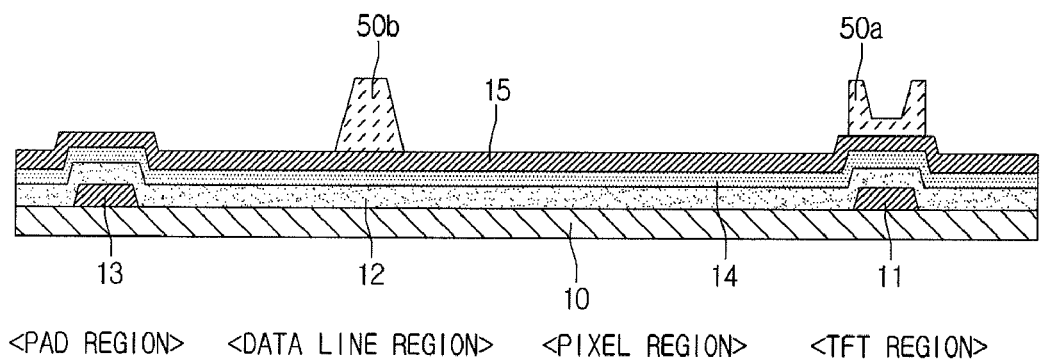
Figure 1C:
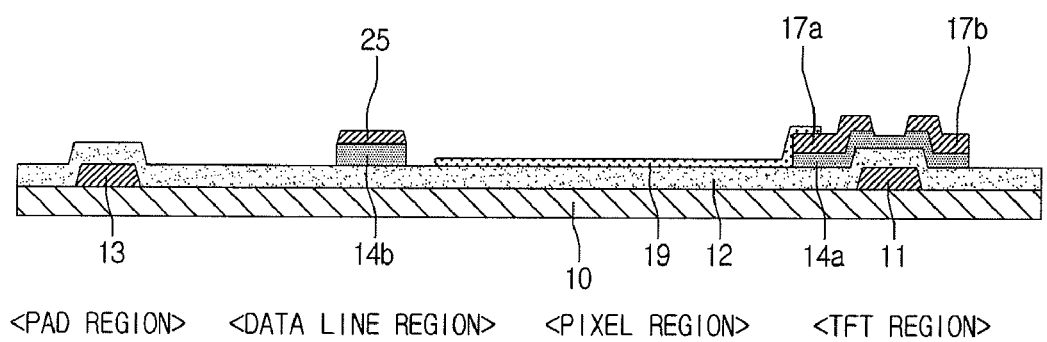
Figure 1D:
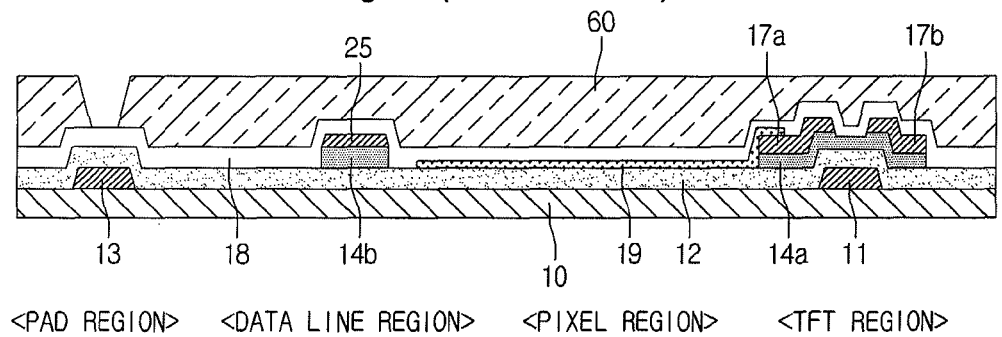
Figure 1E:
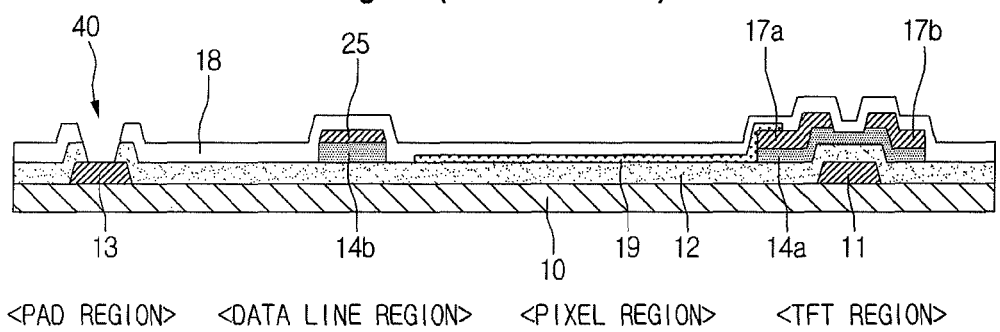
Figure 1F:
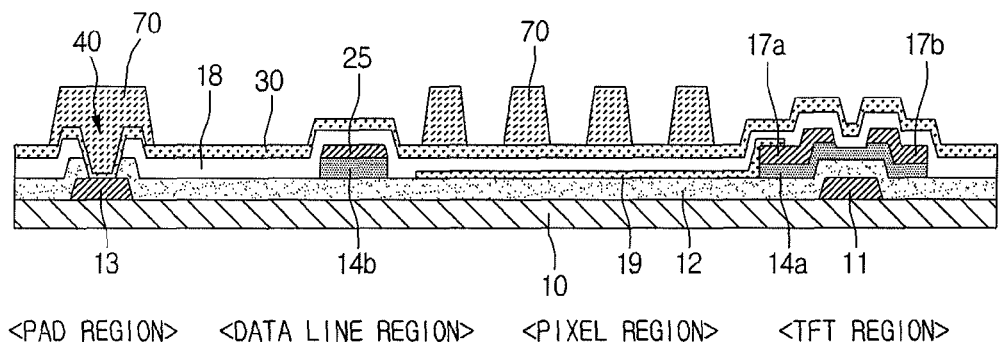
Figure 1G:
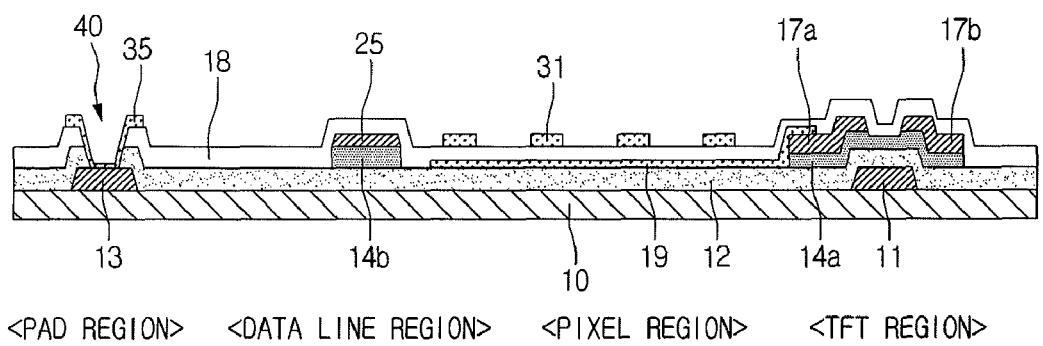

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIGS. 2A to 2I are cross sectional views illustrating a method of fabricating an IPS mode LCD device according to an embodiment of the present disclosure.

Referring to FIGS. 2A through 2I, the fabricating method of the IPS mode LCD device according to the embodiment of the present disclosure forces a conductive metal film to be deposited on a substrate 100. The substrate 100 is defined into a display area including a plurality of pixel regions and a non-display area including pad regions. The conductive metal film can include at least one material selected from a conductive metal group including pure metal materials, such as aluminum Al, an aluminum alloy (AlNd), copper Cu, tungsten W, chrome Cr, molybdenum Mo or others, and aluminum alloys such as aluminum/neodymium Al/Nd, aluminum/chrome Al/Cr, aluminum/molybdenum Al/Mo, or others.

Then, exposing, developing and etching processes are serially performed after a photo resist pattern is formed on the substrate 100 provided with the conductive metal film, according to a first mask process. In accordance therewith, a gate electrode 111 and a gate pad 113 are formed on a TFT region and a pad region, respectively.

When the gate electrode 111 and so on are formed on the substrate 100, a gate insulation film 112, a semiconductor film 114 and a source/drain metal film 115 are sequentially formed on an entire surface of the substrate 100. The semiconductor film 14 includes a pure amorphous silicon layer (a-Si:H) and an impurity-doped amorphous silicon layer (n+ or p+a-Si:H).

The gate insulation film 112 is formed by depositing at least one material selected from an inorganic insulation material group, which includes silicon nitride $SiN_x$ and silicon oxide $SiO_2$, or an organic material group which includes BCB (benzocyclobutene), an acryle-based resin or others. The source/drain metal film 115 is formed by depositing at least one selected from the above-mentioned conductive metal group.

In order to form the impurity-doped amorphous silicon layer on the surface of the pure amorphous silicon layer, a doping gas, such as silane gas $SiH_4$, hydrogen diluents, phosphine $PH_3$ or diborane $B_2H_6$, is put into a chamber in which the substrate 100 is included after letting the air out of the chamber.

Figure 2A:
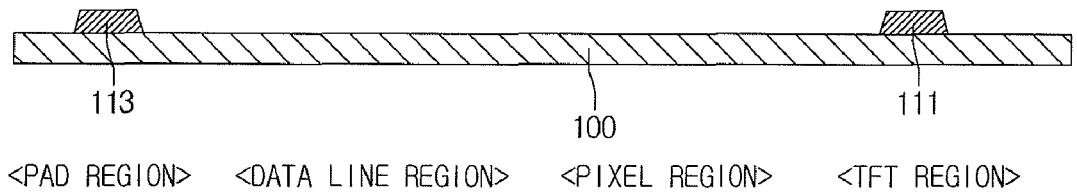
FIGS. 2A to 2I are cross sectional views illustrating a method of fabricating an IPS mode LCD device according to an embodiment of the present disclosure.
Figure 2B:
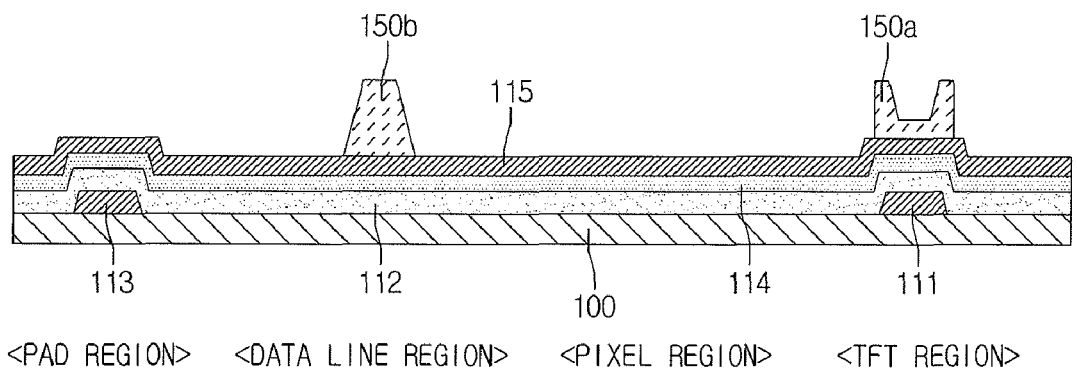

Thereafter, as shown in FIG. 2B, first and second photo resist film 150a and 150b are formed on the source/drain metal film 115 through a second mask process. The second mask process uses a half-tone mask or a diffraction mask.

The half-tone mask or the diffraction mask is configured with a transmission portion, a semi-transmission portion and an interception portion. A plurality of slits or a semitransparent membrane is formed on a mask region corresponding to the semi-transmission portion, thereby lowering light intensity or light transmittance. As such, a part of the photo resist film opposite to the semi-transmission portion can be incompletely exposed. On the other hand, the interception portion is used for completely intercepting light. On the contrary, the transmission portion transmits light and makes another part of the photo resist film opposite thereto to be completely exposed or chemical-changed.

In accordance therewith, the first photo resist film 150a positioned in the region corresponding to the gate electrode 111 is formed to have different thicknesses.

Figure 2C:
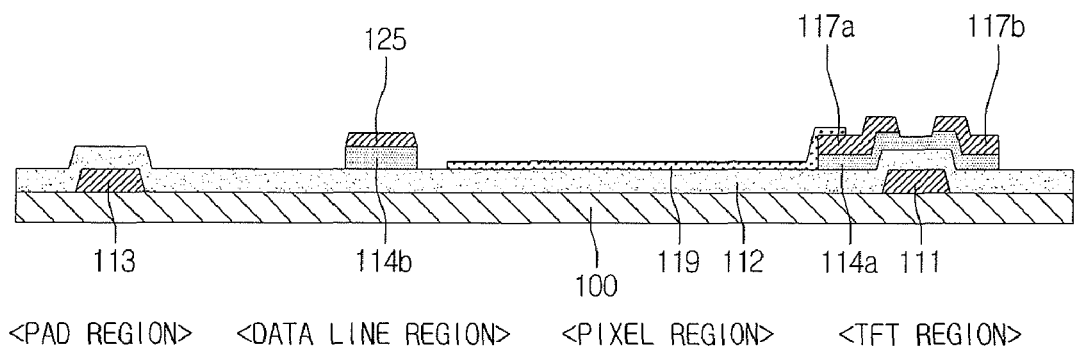

When the above-mentioned first and second photo resist films 150a and 150b are formed on the source/drain metal film 115, an etching process using the first and second photo resist films 150a and 150b as a mask is performed for the source/drain metal film 115 and the semiconductor film 114. Through such an etching process, an active layer 114a and source/drain electrodes 117b and 117a are formed on the gate insulation film 112 opposite to (or over) the gate electrode 111, as shown in FIG. 2C. Also, a data line 125 is formed on a data line region, and furthermore an active pattern 114b is formed under the data line 125.

Afterward, a transparent conductive material, such as ITO (Indium Tin Oxide), IZO (Indium Zinc Oxide) and ITZO (Indium Tin Zinc Oxide), is deposited on the entire surface of the substrate 100 and a third mask process is performed for the deposited transparent conductive material, thereby forming a pixel electrode 119. The pixel electrode 110 comes in direct contact with the drain electrode 117a.

Figure 2D:
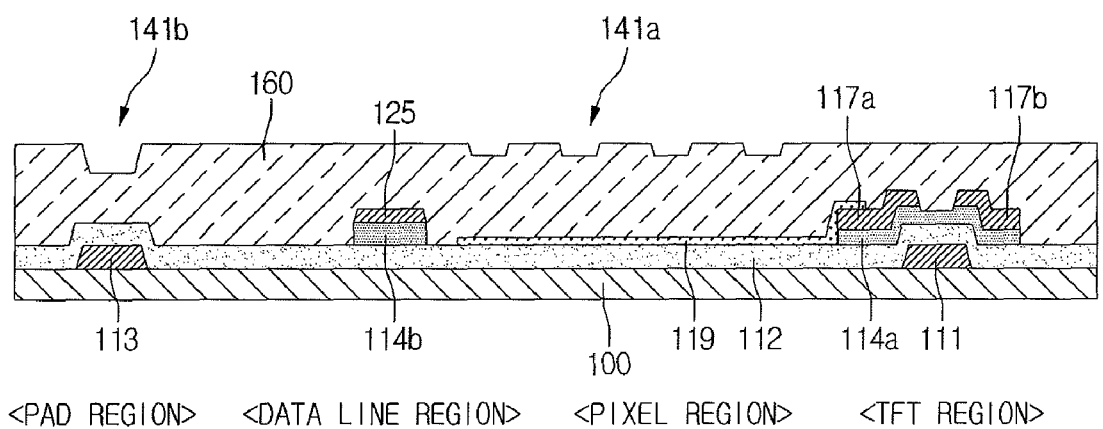

When the above-mentioned pixel electrode 119 is formed on the substrate 100, an organic film 160 is formed on the entire surface of the substrate 100, as shown in FIG. 2D. The organic film 160 can be formed by coating at least one selected from an organic material group, which includes BCB (benzocyclobutene) and acryle-based resins, on the entire surface of the substrate 100.

An imprinting process is performed for the pixel and pad regions after the formation of the organic film 160. As such, first and second depressions 141a and 141b are formed in the surface of the organic film 160.

The second depression 141b positioned in the pad region is formed to have a greater depth than that of the first depression 141a. In accordance therewith, the thickness of the organic film on the pad region in which the second depression 141b is formed becomes less than 1 μm. Meanwhile, the thickness of the organic film 160 on the pixel region in which the first depression 141a is formed becomes about 1.5~2.0 μm.

Figure 2E:
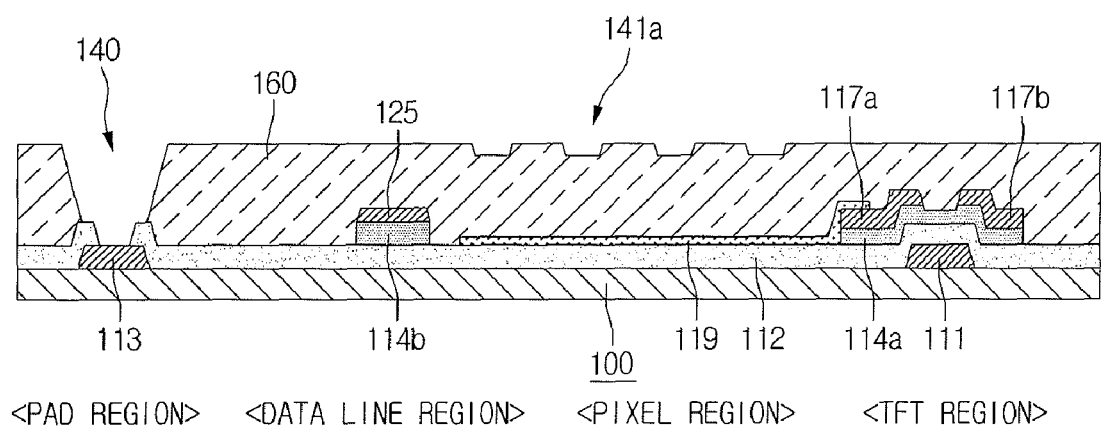

Subsequently, as shown in FIG. 2E, a contact hole 140 is formed in the pad region through an etching process which uses the organic film 160 provided with the first and second depressions 141a and 141b as a mask. This etching process forces the first depression 141a to become deeper.

Figure 2F:
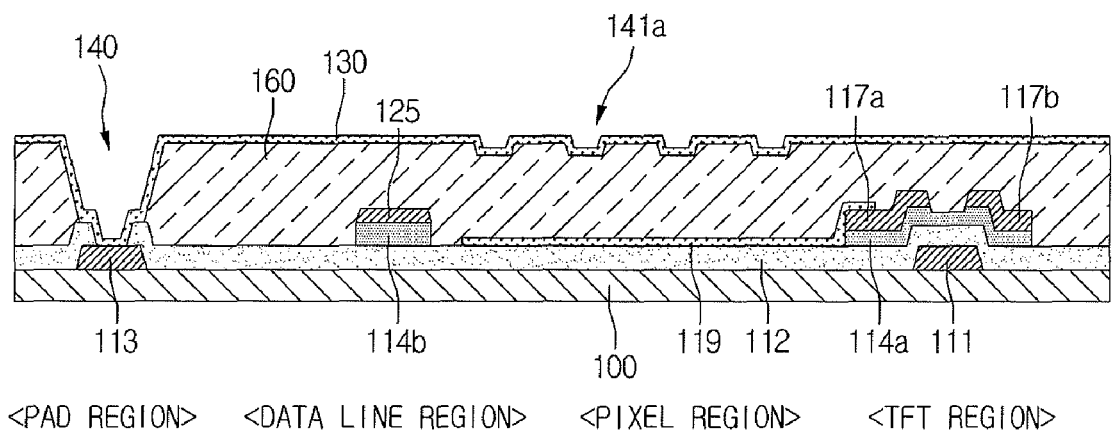
Figure 2G:
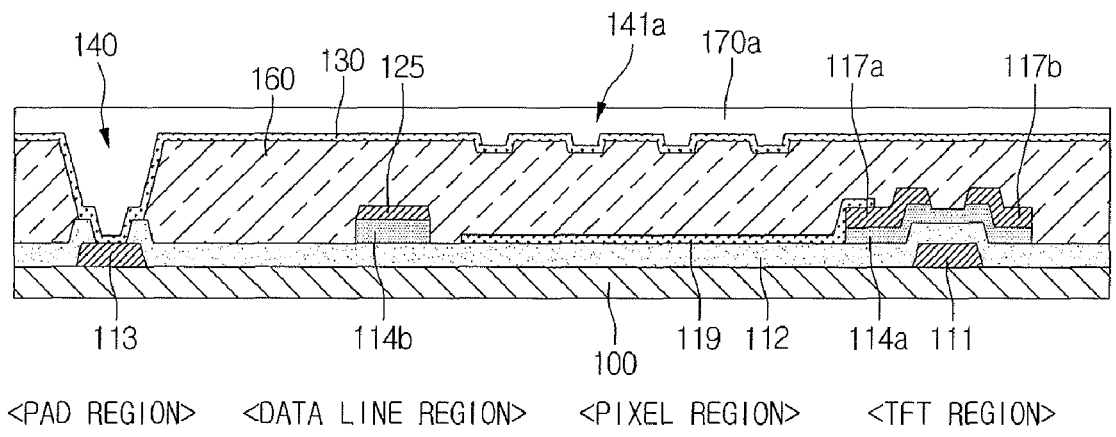
Figure 2H:
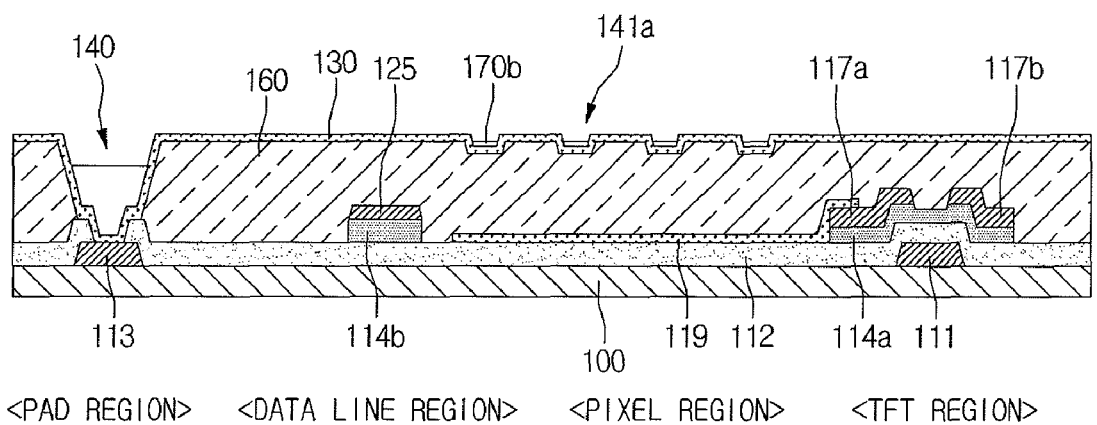

When the above-mentioned contact hole formation process is completed, a common metal film 130 including a transparent conductive material is formed on the entire surface of the substrate 100, as shown in FIGS. 2F through 2H.

Thereafter, a third photo resist film 170a is formed to have a planarized surface on the entire surface of the substrate 100, as shown in FIG. 2G. Then, an etching or ashing process is performed for the third photo resist film 170a, thereby forcing a fourth photo resist film 170b to remain in the contact hole 140 and the first depressions 141a, as shown in FIG. 2H. In other word, the etching or ashing process is used for making the photo resist film remain in only the regions of the contact hole 140 and first depressions 141a, by removing the third photo resist film 170a on the substrate 100.

As seen in FIG. 2H, the fourth photo resist film 170b remains within only the contact hole 140 and first depressions 141a, and the common metal film 130 is externally exposed in the entire regions except the contact hole 140 and first depressions 141a.

Figure 2I:
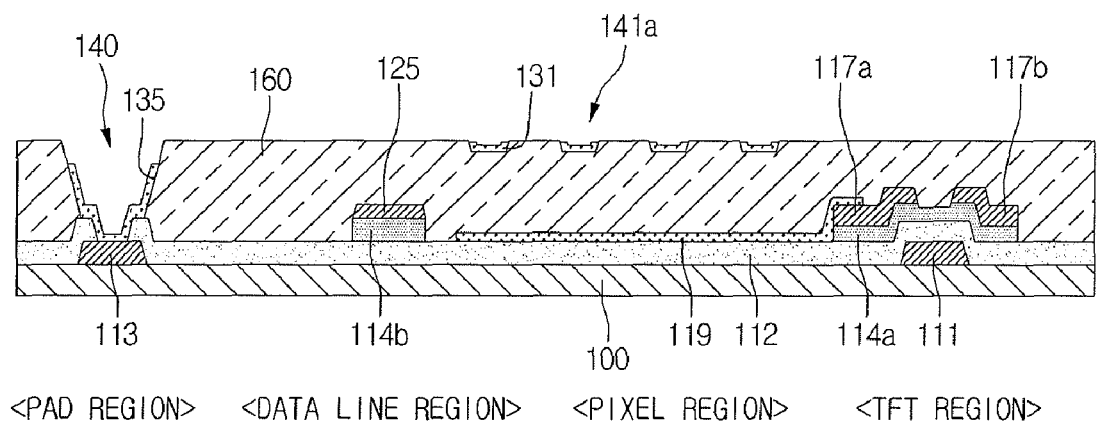

Next, a common electrode 131 is formed on the pixel region by performing a wet or dry etching process for the externally exposed common metal film, as shown in FIG. 2I. At the same time, a gate contact pad 135 electrically contacting the gate pad 113 is also formed on the pad region.

Through the wet or dry etching process, the fourth photo resist film 170b remaining on the common electrode 131 is removed, but the fourth photo resist film 170b on the gate contact pad 135 still remains. Therefore, this embodiment of the present disclosure forces the fourth photo resist film 170b on the gate contact pad 135 to be removed through a laser stripping process.

If the photo resist film has the same etching selectivity as the common metal film, the dry etching process used for the formation of the common electrode 131 can further proceed to remove the remaining photo resist film after the common electrode 131 is formed by etching the common metal film.

In this way, the embodiment of the present disclosure can reduce the number of mask processes by using the imprinting process. Moreover, the organic film can allow a topological difference of the surface caused by the imprinting process to be minimized.

Also, the laser stripping process is locally performed for only the pad region. As such, the time for fabricating an IPS mode LCD device according to the embodiment of the present disclosure can decrease more than that according to the related art.

As described above, the LCD device fabrication method according to the embodiment of the present disclosure can complete a thin film transistor array substrate by only four mask processes. Moreover, the LCD device fabrication method according to the embodiment of the present disclosure can reduce the mask processes using the imprinting process, and furthermore minimize the generation of poor pattern.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A method of fabricating a liquid crystal display device, the method comprising the steps of:

forming a gate electrode and a gate pad on a substrate, which is defined into a display area corresponding to pixel regions and a non-display area corresponding to pad regions, through a first mask process;

sequentially stacking a gate insulation film, an amorphous silicon layer, an impurity-doped amorphous silicon layer and a metal film on the substrate provided with the gate electrode and then forming an active region, a source/drain electrode and a data line through a second mask process which uses one of half-tone and diffraction masks;

forming a transparent conductive material on the substrate provided with the source/drain electrode and forming a pixel electrode through a third mask process;

forming an organic film on the substrate provided with the pixel electrode and performing an imprinting process to form first and second depressions which are respectively positioned in the pixel and pad regions;

performing a second etch process for the organic film provided with the first and second depressions to form a contact hole in the pad region;

sequentially forming a common metal film and a photo resist film on the substrate provided with the contact hole and performing one of etching and ashing processes to expose the common metal film on all the regions except the first depressions and the contact hole; and performing an etching process, which uses the remaining photo resist film within the first depression and contact hole as a mask, to form a common electrode on the pixel region and a gate contact pad on the pad region.

2. The method claimed as claim 1, wherein the organic film on the pixel region in which the first depression is positioned is in a thickness range of approximately 1.5~2.0 μm when the first and second depressions are formed in the organic film through the imprinting process.

3. The method claimed as claim 1, wherein the organic film on the pixel region in which the first depression is positioned has a thickness less than 1.0 μm when the first and second depressions are formed in the organic film through the imprinting process.

4. The method claimed as claim 1, wherein the forming step of the common electrode further includes removing the photo resist film within the contact hole in the pad region using a laser after the formation of the common electrode.

5. The method claimed as claim 1, wherein the second etching process for forming the common electrode continuously proceeds to remove the common metal film and the photo resist film, if the photo resist film has the same etching selectivity as the common metal film.

6. The method claimed as claim 1, wherein the second depression is formed to have a deeper depth than that of the first depression.

* * * * *